(12) United States Patent
Zhang et al.

(10) Patent No.: US 9,318,436 B2
(45) Date of Patent: Apr. 19, 2016

(54) COPPER BASED NITRIDE LINER PASSIVATION LAYERS FOR CONDUCTIVE COPPER STRUCTURES

(71) Applicant: GLOBALFOUNDRIES Inc., Grand Cayman (KY)

(72) Inventors: Xunyuan Zhang, Albany, NY (US); Larry Zhao, Hoeilaart (BE); Ming He, Slingerlands, NY (US); Sean Lin, Watervliet, NY (US); John Iacoponi, Wappingers Falls, NY (US); Errol Todd Ryan, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 11 days.

(21) Appl. No.: 14/470,213

(22) Filed: Aug. 27, 2014

(65) Prior Publication Data

US 2014/0361435 A1    Dec. 11, 2014

Related U.S. Application Data

(62) Division of application No. 13/757,338, filed on Feb. 1, 2013, now Pat. No. 8,859,419.

(51) Int. Cl.
*H01L 23/48* (2006.01)
*H01L 23/52* (2006.01)
(Continued)

(52) U.S. Cl.
CPC .... *H01L 23/53238* (2013.01); *H01L 21/76843* (2013.01); *H01L 21/76856* (2013.01); *H01L 21/76873* (2013.01); *H01L 23/5226* (2013.01); *H01L 23/53233* (2013.01); *H01L 2924/0002* (2013.01)

(58) Field of Classification Search
CPC ............... H01L 23/53238; H01L 21/76873; H01L 21/76856; H01L 21/76843; H01L 23/5226; H01L 23/53233; H01L 23/53223; H01L 21/76846; H01L 23/481
USPC ................. 257/751, 774, E23.001, E23.141, 257/E23.178, E21.575
See application file for complete search history.

(56) References Cited

U.S. PATENT DOCUMENTS

| 6,171,949 B1 | 1/2001 | You et al. |
| 6,365,927 B1 | 4/2002 | Cuchiaro et al. |

(Continued)

OTHER PUBLICATIONS

Office Action from related U.S. Appl. No. 13/757,288 dated Nov. 18, 2013.

*Primary Examiner* — A. Sefer
*Assistant Examiner* — Dilinh Nguyen
(74) *Attorney, Agent, or Firm* — Amerson Law Firm, PLLC

(57) ABSTRACT

One illustrative method disclosed herein includes forming a trench/via in a layer of insulating material, forming a barrier layer in the trench/via, forming a copper-based seed layer on the barrier layer, converting at least a portion of the copper-based seed layer into a copper-based nitride layer, depositing a bulk copper-based material on the copper-based nitride layer so as to overfill the trench/via and performing at least one chemical mechanical polishing process to remove excess materials positioned outside of the trench/via to thereby define a copper-based conductive structure. A device disclosed herein includes a layer of insulating material, a copper-based conductive structure positioned in a trench/via within the layer of insulating material and a copper-based silicon or germanium nitride layer positioned between the copper-based conductive structure and the layer of insulating material.

10 Claims, 4 Drawing Sheets

(51) Int. Cl.
    *H01L 29/40*   (2006.01)
    *H01L 23/532*  (2006.01)
    *H01L 23/522*  (2006.01)
    *H01L 21/768*  (2006.01)

(56) References Cited

U.S. PATENT DOCUMENTS

| | | | |
|---|---|---|---|
| 6,787,480 | B2 | 9/2004 | Aoki et al. |
| 6,849,535 | B2 | 2/2005 | Noguchi et al. |
| 7,094,705 | B2 | 8/2006 | Lin et al. |
| 7,268,087 | B2 | 9/2007 | Aoki et al. |
| 7,289,183 | B2 | 10/2007 | Gan et al. |
| 7,294,217 | B2 | 11/2007 | Beatson et al. |
| 7,511,300 | B2 | 3/2009 | Lee et al. |
| 7,524,755 | B2 * | 4/2009 | Widodo et al. ............... 438/627 |
| 7,586,197 | B2 | 9/2009 | Lee et al. |
| 7,687,333 | B2 | 3/2010 | Yang et al. |
| 7,851,920 | B2 | 12/2010 | Lee et al. |
| 8,039,395 | B2 | 10/2011 | Meyer et al. |
| 8,105,937 | B2 | 1/2012 | Cheng et al. |
| 8,158,499 | B2 | 4/2012 | Lee et al. |
| 8,173,492 | B2 | 5/2012 | Lee et al. |
| 8,177,989 | B2 | 5/2012 | Gan et al. |
| 8,193,089 | B2 * | 6/2012 | Khoueir et al. ............... 438/643 |
| 2002/0125573 | A1 | 9/2002 | Cuchiaro et al. |
| 2002/0155702 | A1 | 10/2002 | Aoki et al. |
| 2003/0022482 | A1 | 1/2003 | Nagashima |
| 2006/0063375 | A1 | 3/2006 | Sun et al. |
| 2009/0045703 | A1 | 2/2009 | Barber et al. |
| 2009/0100668 | A1 | 4/2009 | Harris et al. |
| 2009/0162982 | A1 | 6/2009 | Lee et al. |
| 2009/0226611 | A1 | 9/2009 | Suzuki et al. |
| 2011/0114375 | A1 | 5/2011 | Ohmi et al. |
| 2011/0227224 | A1 | 9/2011 | Kitao |
| 2011/0309510 | A1 | 12/2011 | Lee et al. |

* cited by examiner

COPPER BASED NITRIDE LINER PASSIVATION LAYERS FOR CONDUCTIVE COPPER STRUCTURES

CROSS-REFERENCE TO RELATED APPLICATION

This is a divisional of co-pending application Ser. No. 13/757,338, filed Feb. 1, 2013.

BACKGROUND OF THE INVENTION

1. Field of the Invention

Generally, the present disclosure relates to the manufacture of sophisticated semiconductor devices, and, more specifically, to various methods of forming copper-based nitride liner/passivation layers for copper-based conductive structures, such as conductive lines/vias, that are formed on integrated circuit products.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

In a field effect transistor, the conductivity of the channel region, i.e., the drive current capability of the conductive channel, is controlled by a gate electrode formed adjacent to the channel region and separated therefrom by a thin gate insulation layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as the channel length of the transistor. Thus, in modern ultra-high density integrated circuits, device features, like the channel length, have been steadily decreased in size to enhance the performance of the semiconductor device and the overall functionality of the circuit. For example, the gate length (the distance between the source and drain regions) on modern transistor devices has been continuously reduced over the years and further scaling (reduction in size) is anticipated in the future. This ongoing and continuing decrease in the channel length of transistor devices has improved the operating speed of the transistors and integrated circuits that are formed using such transistors. However, there are certain problems that arise with the ongoing shrinkage of feature sizes that may at least partially offset the advantages obtained by such feature size reduction. For example, as the channel length is decreased, the pitch between adjacent transistors likewise decreases, thereby increasing the density of transistors per unit area. This scaling also limits the size of the conductive contact elements and structures, which has the effect of increasing their electrical resistance. In general, the reduction in feature size and increased packing density makes everything more crowded on modern integrated circuit devices, at both the device level and within the various metallization layers.

Improving the functionality and performance capability of various metallization systems has also become an important aspect of designing modern semiconductor devices. One example of such improvements is reflected in the increased use of copper metallization systems in integrated circuit devices and the use of so-called "low-k" dielectric materials (materials having a dielectric constant less than about 3) in such devices. Copper metallization systems exhibit improved electrical conductivity as compared to, for example, prior metallization systems that used tungsten for the conductive lines and vias. The use of low-k dielectric materials tends to improve the signal-to-noise ratio (S/N ratio) by reducing crosstalk as compared to other dielectric materials with higher dielectric constants. However, the use of such low-k dielectric materials can be problematic as they tend to be less resistant to metal migration as compared to some other dielectric materials.

Copper is a material that is difficult to etch using traditional masking and etching techniques. Thus, conductive copper structures, e.g., conductive lines or vias, in modern integrated circuit devices are typically formed using known single or dual damascene techniques. In general, the damascene technique involves (1) forming a trench/via in a layer of insulating material, (2) depositing one or more relatively thin barrier or liner layers (e.g., TiN, Ta, TaN), (3) forming copper material across the substrate and in the trench/via, and (4) performing a chemical mechanical polishing process to remove the excess portions of the copper material and the barrier layer(s) positioned outside of the trench/via to define the final conductive copper structure. The copper material is typically formed by performing an electrochemical copper deposition process after a thin conductive copper seed layer is deposited by physical vapor deposition on the barrier layer.

Unfortunately, it is becoming more difficult to satisfy the ongoing demand for smaller and smaller conductive lines and conductive vias for a variety of reasons. One such problem with traditional barrier layer materials, e.g., tantalum, tantalum nitride, ruthenium, is the minimum thickness to which those materials must be formed so that they can be formed as continuous layers and perform their intended functions. Thus, having to make the barrier material a certain minimum thickness means that there is less room in the trench for the copper material. Accordingly, the overall resistance of the conductive structure increases, as the barrier layer material is less conductive than copper. Additionally, copper seed layers are typically formed to a thickness of about 5 nm to account for a portion of the seed layer will be oxidized, e.g., about 2-3 nm, between the time the copper seed layer is initially formed and the actual plating process. The additional thickness required for the copper seed layer also means that there is less room in the trench, thereby making filling operations more difficult. The presence of the oxidized seed layer may also lead to undesirable migration of oxygen in the surrounding structures.

The present disclosure is directed to various methods of forming copper-based nitride liner/passivation layers for copper-based conductive structures that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming copper-based nitride liner/passivation layers for copper-based conductive structures that are formed on integrated circuit products. One illustrative method disclosed herein includes forming a trench/via in a layer of insulating material, forming a barrier layer in the trench/via, forming a copper-based seed layer on the barrier layer, converting at least a portion of the copper-based seed layer into a copper-based nitride layer, depositing a bulk copper-based material on the copper-based nitride layer so as to overfill the trench/via and performing at least one chemical mechanical polishing process to remove excess materials positioned outside of the trench/via to thereby define a copper-based conductive structure.

One illustrative device disclosed herein includes a layer of insulating material, a copper-based conductive structure positioned in a trench/via within the layer of insulating material and a copper-based silicon nitride layer positioned between the copper-based conductive structure and the layer of insulating material.

BRIEF DESCRIPTION OF THE DRAWINGS

The disclosure may be understood by reference to the following description taken in conjunction with the accompanying drawings, in which like reference numerals identify like elements, and in which.

Figure 1A:
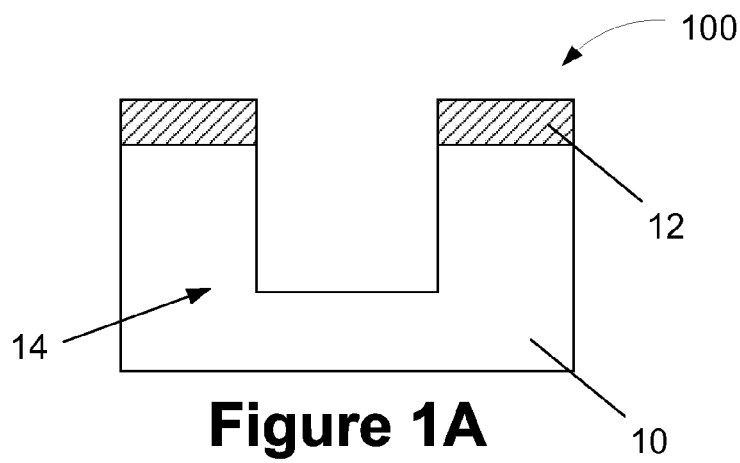
FIGS. 1A-1J depict various methods disclosed herein of forming copper-based nitride liner/passivation layers for copper-based conductive structures, such as conductive lines/vias, that are formed on integrated circuit products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming copper-based nitride liner/passivation layers for copper-based conductive structures, such as conductive lines/vias, that are formed on integrated circuit products. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASIC's, logic devices, memory devices, etc. With reference to the attached drawings, various illustrative embodiments of the methods disclosed herein will now be described in more detail.

FIG. 1A is a simplified view of an illustrative integrated circuit device 100 at an early stage of manufacturing that is formed above a semiconductor substrate (not shown). The substrate may have a variety of configurations, such as a bulk substrate configuration, an SOI configuration, and it may be made of materials other than silicon. Thus, the terms "substrate" or "semiconducting substrate" should be understood to cover all semiconducting materials and all forms of such materials. The device 100 may be any type of integrated circuit device that employs any type of a conductive copper structure, such as a conductive line or via commonly found on integrated circuit devices. At the point of fabrication depicted in FIG. 1A, a trench/via 14 has been formed in a layer of insulating material 10 by performing known photolithography and etching techniques through a patterned mask layer 12. The trench/via 14 is intended to be representative of any type of opening formed in any type of insulating material 10 wherein a conductive copper structure may be formed. The trench/via 14 may be of any desired shape, depth or configuration. For example, in some embodiments, the trench/via 14 is a classic trench that does not extend to an underlying layer of material, such as the illustrative trench 14 depicted in FIG. 1A. In other embodiments, the trench/via 14 may be a through-hole type feature, e.g., a classic via, that extends all of the way through the layer of insulating material 10 and exposes an underlying layer of material or an underlying conductive structure (not shown), such as an underlying metal line. Thus, the shape, size, depth or configuration of the trench/via 14 should not be considered to be a limitation of the present invention. The trench/via 14 may be formed by performing any of a variety of different etching processes, e.g., a dry reactive ion etching process, through the patterned mask layer 12.

The various components and structures of the device 100 may be initially formed using a variety of different materials and by performing a variety of known techniques. For example, the layer of insulating material 10 may be comprised of any type of insulating material, e.g., silicon dioxide, a low-k insulating material (k value less than 3), etc., it may be formed to any desired thickness and it may be formed by performing, for example, a chemical vapor deposition (CVD) process or spin-on deposition (SOD) process, etc. The patterned mask layer 12 may be formed using known photolithography and/or etching techniques. The patterned mask layer 12 is intended to be representative in nature as it could be comprised of a variety of materials, such as, for example, a photoresist material, silicon nitride, silicon oxynitride, silicon dioxide, a metal, etc. Moreover, the patterned mask layer 12 could be comprised of multiple layers of material, such as, for example, a pad oxide layer (not shown) and a pad silicon nitride layer (not shown) that is formed on the pad oxide layer. Thus, the particular form and composition of the patterned mask layer 12 and the manner in which it is made should not be considered a limitation of the present invention. In the case where the patterned mask layer 12 is comprised of one or more hard mask layers, such layers may be formed by performing a variety of known processing techniques, such as a CVD process, an atomic layer deposition (ALD) process, a physical vapor deposition (PVD) process, or plasma enhanced versions of such processes, and the thickness of such a layer(s) may vary depending upon the particular application. In one illustrative embodiment, the patterned mask layer 12 is a hard mask layer of silicon nitride that is initially formed by performing a CVD process to deposit a layer of silicon nitride and thereafter patterning the layer of silicon nitride using known sidewall image transfer techniques and/or photolithographic techniques combined with performing known etching techniques.

Figure 1B:
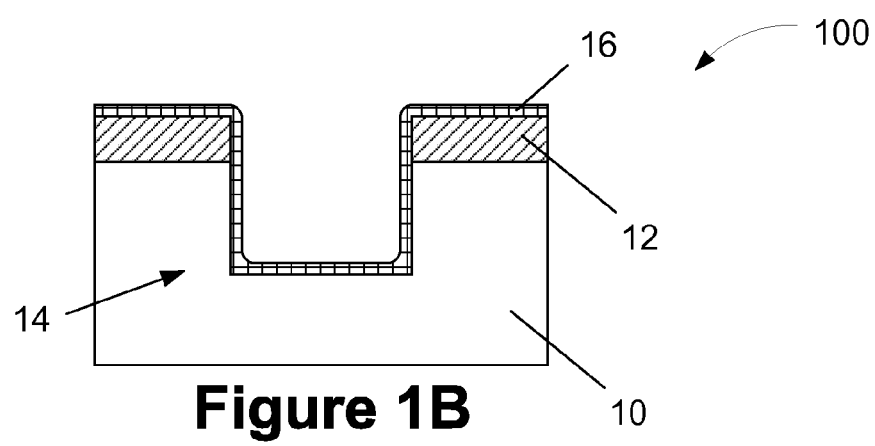

Next, as shown in FIG. 1B, a deposition process, e.g., a PVD, CVD or ALD process, is performed to form a barrier layer 16 across the product 100 and in the trench/via 14. The barrier layer 16 may be comprised of single or multiple layers of any of a variety of different materials, e.g., tantalum, cobalt, ruthenium, manganese, tantalum nitride, titanium nitride, titanium or combinations thereof. The thickness of the barrier layer 16 may vary depending upon the particular application, e.g., 0.5-3 nm.

Figure 1C:
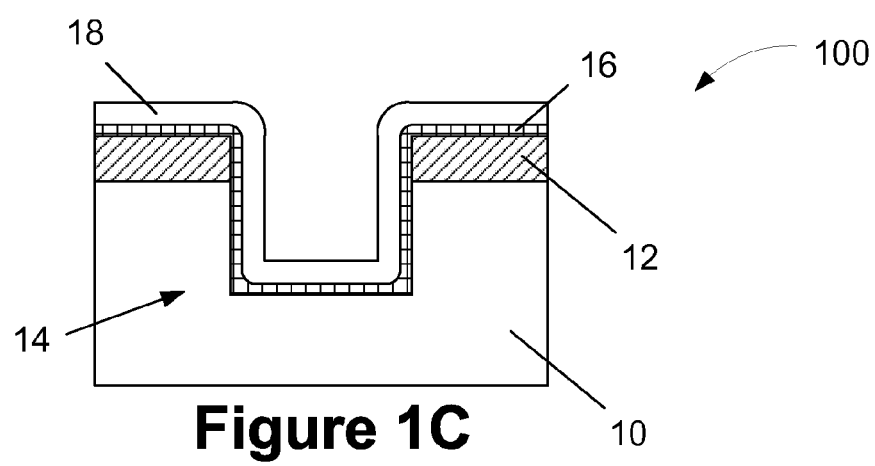

FIG. 1C depicts the device 100 after a deposition process, e.g., a PVD, CVD or ALD process, is performed to form a copper-based seed layer 18 across the product 100 and in the trench/via 14 on the barrier layer 16. The copper-based seed layer 18 may be comprised of substantially pure copper. The thickness of the copper seed layer 18 may vary depending upon the particular application, e.g., 2-10 nm. The relative sizes of the layers 16, 18 to the finished conductive copper-based structure are exaggerated in the attached drawings to facilitate explanation.

Figure 1D:
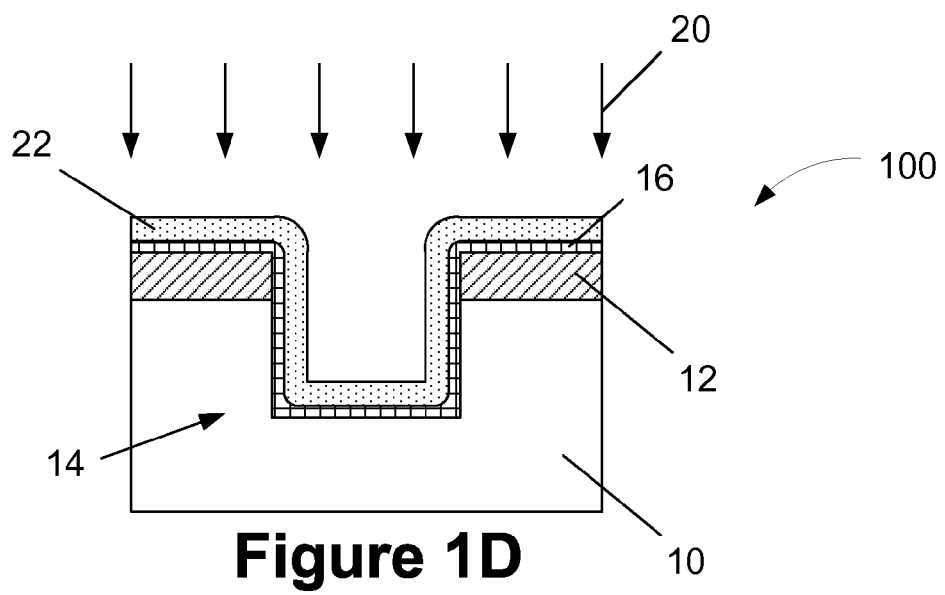

Thereafter, as shown in FIG. 1D, a process operation 20 is performed to convert substantially the entire copper-based seed layer 18 to a copper-based nitride layer 22. In one illustrative embodiment, the process operation 20 is a thermal or plasma operation that may be performed using at least one nitrogen-containing precursor. For example, in one embodiment, the process operation may be performed using trigermylamine (($H_3Ge)_3N$) or trisilylamine (($H_3Si)_3N$) to react with the copper-based seed layer 18 and thereby form a layer 22 of copper germanium nitride ($Cu_xGeN_y$) or a layer 22 of copper silicon nitride ($Cu_xSiN_y$), respectively. In this embodiment, the process operation may be either a thermal or plasma based process that is performed at a temperature that falls within the range of about 40-500° C.

In another embodiment of the process operation, germane ($GeH_4$) or silane ($SiH_4$), at a flow rate of about 1-100 sccm, may be introduced in a plasma based operation to react with the copper-based seed layer 18. In this example, a nitrogen-containing gas, e.g., nitrogen, ammonium, etc., at a flow rate of about 1-100 sccm, is introduced with the germane or silane to thereby form the copper-based nitride layer 22 comprised of copper germanium nitride ($Cu_xGeN_y$) or copper silicon nitride ($Cu_xSiN_y$), respectively. The reaction temperature of this embodiment of the process operation 20 may be on the order of about 40-500° C. As compared to the traditional copper seed layer used to form conductive copper structures, the copper-based nitride layer 22 functions as a barrier for copper and oxygen and has a much lower electrical resistance as compared to commonly employed barrier layers such as ruthenium, cobalt, tantalum and tantalum nitride.

In yet another example, after the copper-based seed layer 18 is formed, the process operation 20 involves performing a plasma doping process whereby nitrogen or ammonia and germanium or silicon (depending upon the application) are introduced into the copper-based seed layer 18. Such a plasma doping process may be performed at a temperature within the range of about 40-500° C. This plasma treatment process converts the copper-based seed layer 18 into the copper-based nitride layer 22 comprised of copper germanium nitride ($Cu_xGeN_y$) or copper silicon nitride ($Cu_xSiN_y$), respectively.

In yet another embodiment, the copper-based nitride layer 22 is formed by introducing various materials during the process of forming the copper-based seed layer 18 using a traditional deposition process using germanium or silicon containing materials. In one embodiment, nitrogen or ammonia and germanes of general formula $Ge_nH_{2n+2}$ or germanium tetrahalides may be introduced during the deposition process that is performed to form the copper-based seed layer 18 to thereby result in a layer of copper germanium nitride ($Cu_xGeN_y$) 22. In another example, nitrogen or ammonia and silane ($SiH_4$) or ($Si_nH_{2n+2}$) or silicon terahalides may be introduced during the deposition process that is performed to form the copper-based seed layer 18 to thereby result in a layer of copper silicon nitride ($Cu_xSiN_y$) 22.

Figure 1E:
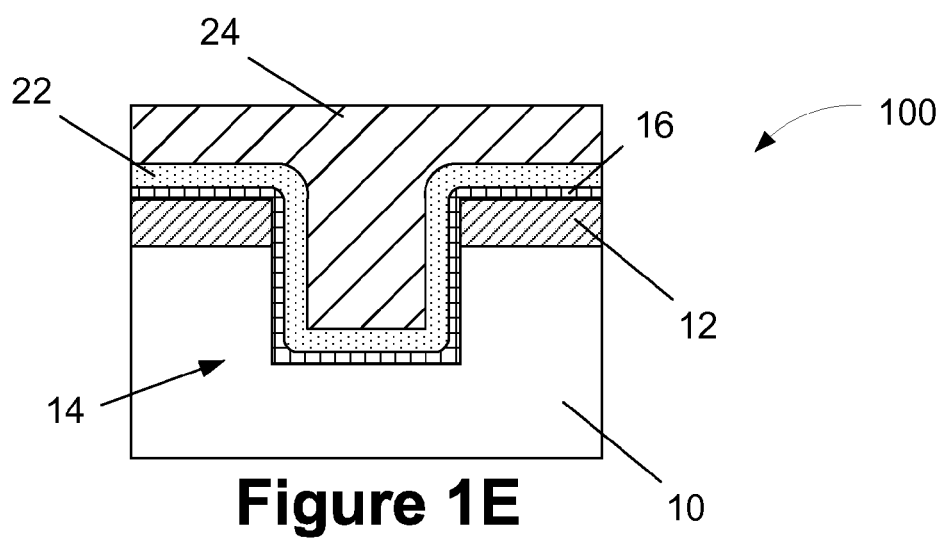

Next, as shown in FIG. 1E, an appropriate amount of bulk copper-based material 24, e.g., a layer of copper about 500 nm or so thick, is formed across the device 100 in an attempt to insure that the trench/via 14 is completely filled with copper. In an electroplating process, electrodes (not shown) are coupled to the copper-based nitride layer 22 at the perimeter of the device 100 and a current is passed through the copper-based nitride layer 22, which causes the bulk copper material 24 to deposit and build on the copper-based nitride layer 22. The copper-based materials 18, 24 may be comprised of pure copper, or a copper alloy, including, for example, copper-aluminum, copper-cobalt, copper-manganese, copper-magnesium, copper-tin and copper-titanium, with alloy concentration ranging from 0.1 atomic percent to about 50 atomic percent based on the particular application.

Figure 1F:
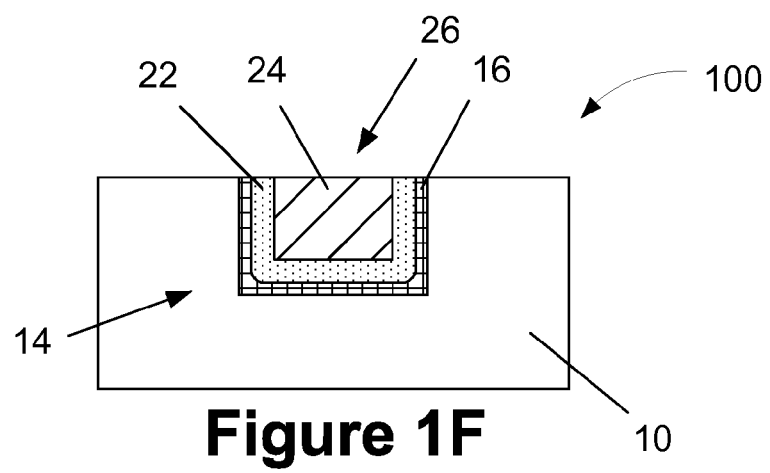

FIG. 1F depicts the device 100 after at least one chemical mechanical polishing (CMP) process has been performed to remove excess bulk copper-based material 24, the copper-based nitride layer 22 and the barrier layer 16 positioned outside of the trench/via 14 to thereby define a conductive copper-based structure 26. In this embodiment, the patterned mask layer 12 is depicted as being removed as part of the polishing process. In other embodiments, the patterned mask layer 12 may remain in place above the layer of insulating material 10 and act as a polish-stop layer during the CMP process(es).

Figure 1G:
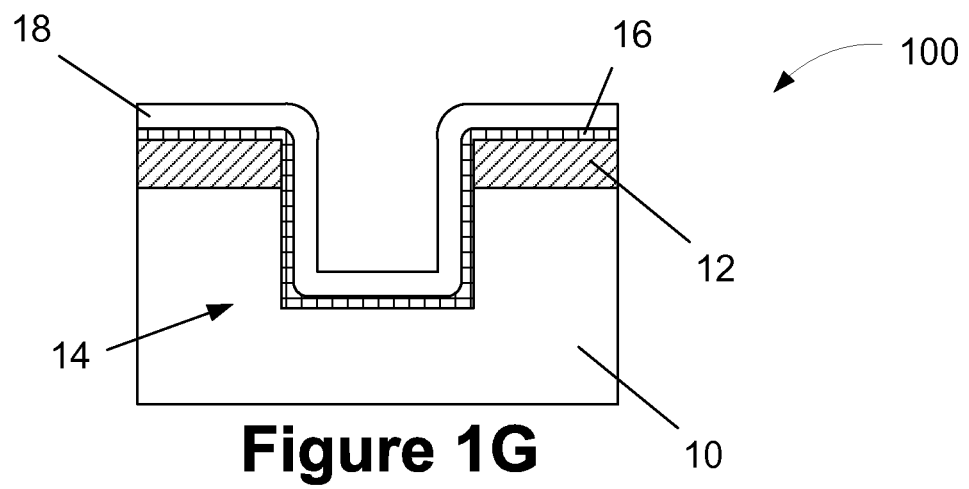
Figure 1H:
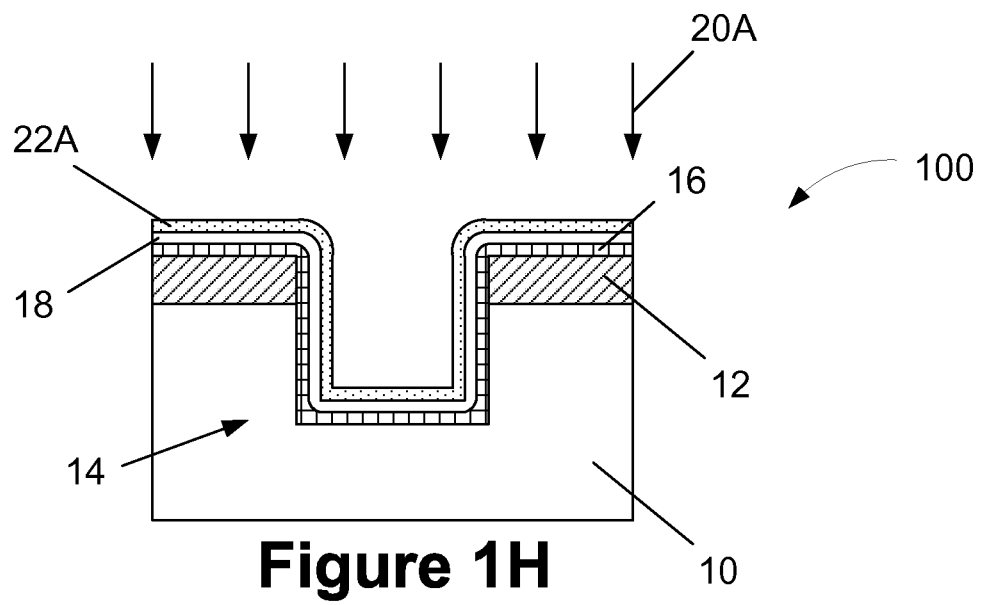
Figure 1I:
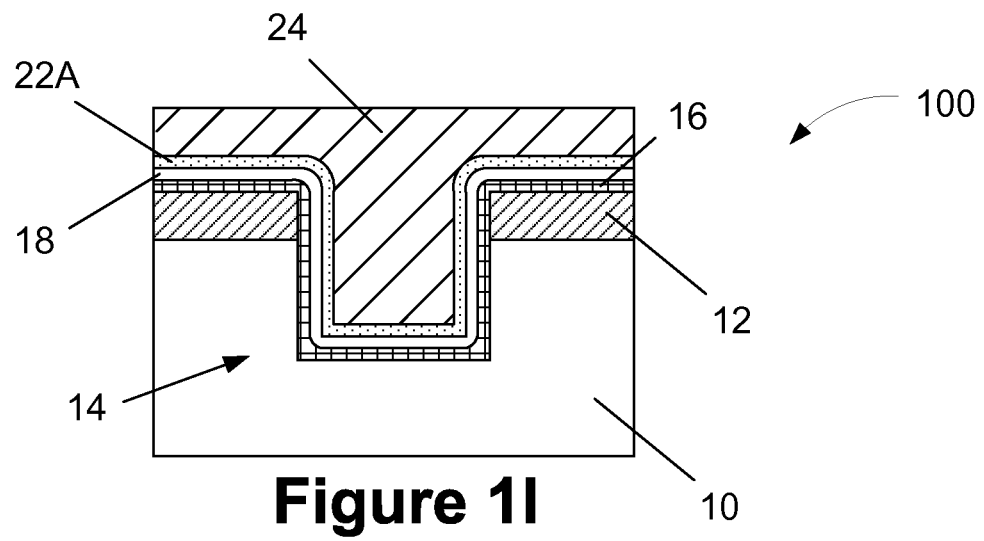
Figure 1J:
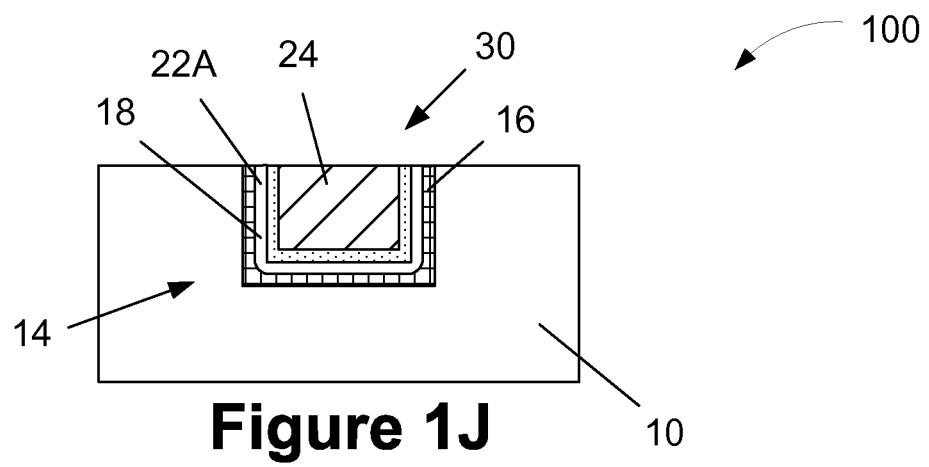

FIGS. 1G-1J depict another illustrative embodiment disclosed herein. FIG. 1G depicts the device 100 at a point of fabrication wherein the barrier layer 16 and the copper-based seed layer 18 have been formed above the device 100 as previously described. Next, as shown in FIG. 1H, a process operation 20A is performed to form a relatively thin copper-based nitride layer 22A on the remaining portions of the copper-based seed layer 18. In one illustrative embodiment, the copper-based nitride layer 22A may be formed by simply varying the duration and/or temperature of either of the process operations described above with respect to the formation of the previously described copper-based nitride layer 22. In one illustrative example, the copper-based nitride layer 22A may have a thickness of about 1-3 nm, and the remaining portions of the copper-based seed layer 18 may have a thickness of about 2-7 nm. In effect, in this embodiment, the copper-based nitride layer 22A acts as a passivation layer for the underlying copper-based seed layer 18. Thereafter, as shown in FIG. 1I, the bulk copper material 24 was formed as described above. Then, as shown in FIG. 1J, the previously described CMP process(es) was performed to remove excess materials positioned outside of the trench/via 14. As will be appreciated by those skilled in the art after a complete reading of the present application, the use of the copper-based nitride layers disclosed herein may be very beneficial as it relates to the formation of conductive copper structures on integrated circuit devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A device, comprising
   a layer of insulating material;
   a copper-based conductive structure positioned in a trench/via within said layer of insulating material;
   a copper-based silicon or germanium nitride layer positioned between said copper-based conductive structure and said layer of insulating material;
   a barrier layer positioned between said copper-based silicon or germanium nitride layer and said layer of insulating material; and
   a copper seed layer positioned between said barrier layer and said copper-based silicon or germanium nitride layer.

2. The device of claim 1, wherein said copper seed layer contacts said copper-based silicon or germanium nitride layer.

3. The device of claim 1, wherein said copper-based silicon or germanium nitride layer is comprised of one of copper germanium nitride ($Cu_xGeN_y$) or copper silicon nitride ($Cu_xSiN_y$).

4. The device of claim 1, wherein said copper seed layer contacts both said barrier layer and said copper-based silicon or germanium nitride layer.

5. The device of claim 1, wherein said copper seed layer contacts both said barrier layer and said copper-based silicon or germanium nitride layer.

6. A device, comprising
   a layer of insulating material;
   a copper-based conductive structure positioned in a trench/via within said layer of insulating material;
   a barrier layer positioned in said trench/via;
   a copper-based silicon or germanium nitride layer positioned between said copper-based conductive structure and said barrier layer, said copper-based silicon or germanium nitride layer contacting said copper-based conductive structure; and
   a copper seed layer positioned between said barrier layer and said copper-based silicon or germanium nitride layer.

7. The device of claim 6, wherein said copper-based silicon or germanium nitride layer contacts said copper seed layer.

8. The device of claim 6, wherein said copper-based silicon or germanium nitride layer is comprised of one of copper germanium nitride ($Cu_xGeN_y$) or copper silicon nitride ($Cu_xSiN_y$).

9. A device, comprising
   a layer of insulating material;
   a copper-based conductive structure positioned in a trench/via within said layer of insulating material;
   a barrier layer positioned in said trench/via; and
   a layer of copper germanium nitride ($Cu_xGeN_y$) positioned between said copper-based conductive structure and said barrier layer, wherein said layer of copper germanium nitride ($Cu_xGeN_y$) is in physical contact with both said barrier layer and said copper-based conductive structure.

10. A device, comprising
    a layer of insulating material;
    a copper-based conductive structure positioned in a trench/via within said layer of insulating material;
    a barrier layer positioned in said trench/via;
    a copper seed layer positioned on and in physical contact with said barrier layer; and
    a layer of copper germanium nitride ($Cu_xGeN_y$) positioned between said copper-based conductive structure and said copper seed layer, wherein said layer of copper germanium nitride ($Cu_xGeN_y$) is in physical contact with both said copper seed layer and said copper-based conductive structure.

* * * * *